US012642097B2

(12) United States Patent
Chen et al.

(10) Patent No.: US 12,642,097 B2
(45) Date of Patent: May 26, 2026

(54) SEMICONDUCTOR PACKAGE HAVING CONDUCTIVE LAYER COVERING BACK SURFACES OF DIES AND MANUFACTURING METHOD OF SEMICONDUCTOR PACKAGE

(71) Applicant: Taiwan Semiconductor Manufacturing Company, Ltd., Hsinchu (TW)

(72) Inventors: Hsien-Wei Chen, Hsinchu City (TW); Meng-Liang Lin, Hsinchu (TW); Kuan Liang Liu, New Taipei City (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 530 days.

(21) Appl. No.: 17/746,822

(22) Filed: May 17, 2022

(65) Prior Publication Data

US 2023/0402403 A1 Dec. 14, 2023

(51) Int. Cl.
| | |
|---|---|
| *H10W 42/00* | (2026.01) |
| *H10W 70/05* | (2026.01) |
| *H10W 70/60* | (2026.01) |
| *H10W 70/65* | (2026.01) |
| *H10W 70/685* | (2026.01) |
| *H10W 74/01* | (2026.01) |
| *H10W 74/10* | (2026.01) |
| *H10W 74/15* | (2026.01) |
| *H10W 90/00* | (2026.01) |

(52) U.S. Cl.
CPC ......... *H10W 42/121* (2026.01); *H10W 70/05* (2026.01); *H10W 70/093* (2026.01); *H10W 70/611* (2026.01); *H10W 70/65* (2026.01); *H10W 70/685* (2026.01); *H10W 74/012* (2026.01); *H10W 74/016* (2026.01); *H10W 74/019* (2026.01); *H10W 74/117* (2026.01); *H10W 74/121* (2026.01); *H10W 74/15* (2026.01); *H10W 90/00* (2026.01)

(58) Field of Classification Search
CPC ... H01L 23/562; H01L 21/563; H01L 21/568; H01L 23/3128; H01L 23/3135; H01L 25/0655; H01L 21/565; H01L 21/3128; H10W 70/05; H10W 70/093; H10W 70/611; H10W 70/65; H10W 74/012; H10W 74/121; H10W 74/15
See application file for complete search history.

(56) References Cited

U.S. PATENT DOCUMENTS

| | | | |
|---|---|---|---|
| 10,410,993 B2 * | 9/2019 | Ko | H01L 21/311 |
| 2010/0052156 A1 * | 3/2010 | Appelt | H01L 23/49816 |
| | | | 257/E23.101 |

(Continued)

*Primary Examiner* — Khiem D Nguyen
(74) *Attorney, Agent, or Firm* — JCIPRNET

(57) ABSTRACT

A semiconductor package includes an interconnect structure, a plurality of dies disposed on the interconnect structure in a side-by-side manner, an underfill filling between the interconnect structure and the plurality of dies and filling a lower part of a gap between adjacent two of the plurality of dies, a conductive layer at least covering back surfaces of the adjacent two of the plurality of dies and filling an upper part of the gap, and an encapsulating material laterally encapsulating the plurality of dies and the conductive layer.

20 Claims, 15 Drawing Sheets

(56)        References Cited

U.S. PATENT DOCUMENTS

| | | | | |
|---|---|---|---|---|
| 2013/0241044 A1* | 9/2013 | Kim | .................... | H01L 23/4334 |
| | | | | 257/E23.18 |
| 2016/0247767 A1* | 8/2016 | Kim | .................... | H01L 23/3128 |
| 2018/0301420 A1* | 10/2018 | Kim | .................... | H01L 21/4885 |
| 2020/0058571 A1* | 2/2020 | Wang | ................. | H01L 23/3128 |
| 2020/0058632 A1* | 2/2020 | Chen | .................... | H01L 21/565 |
| 2020/0091126 A1* | 3/2020 | Lin | ......................... | H01L 24/20 |
| 2020/0135649 A1* | 4/2020 | Chang | ............... | H01L 21/6836 |
| 2021/0020605 A1* | 1/2021 | Hiner | ..................... | H01L 24/96 |
| 2021/0233815 A1* | 7/2021 | Strothmann | ........ | H01L 23/3135 |
| 2022/0189907 A1* | 6/2022 | Nam | ...................... | H01L 25/18 |

* cited by examiner

SEMICONDUCTOR PACKAGE HAVING CONDUCTIVE LAYER COVERING BACK SURFACES OF DIES AND MANUFACTURING METHOD OF SEMICONDUCTOR PACKAGE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
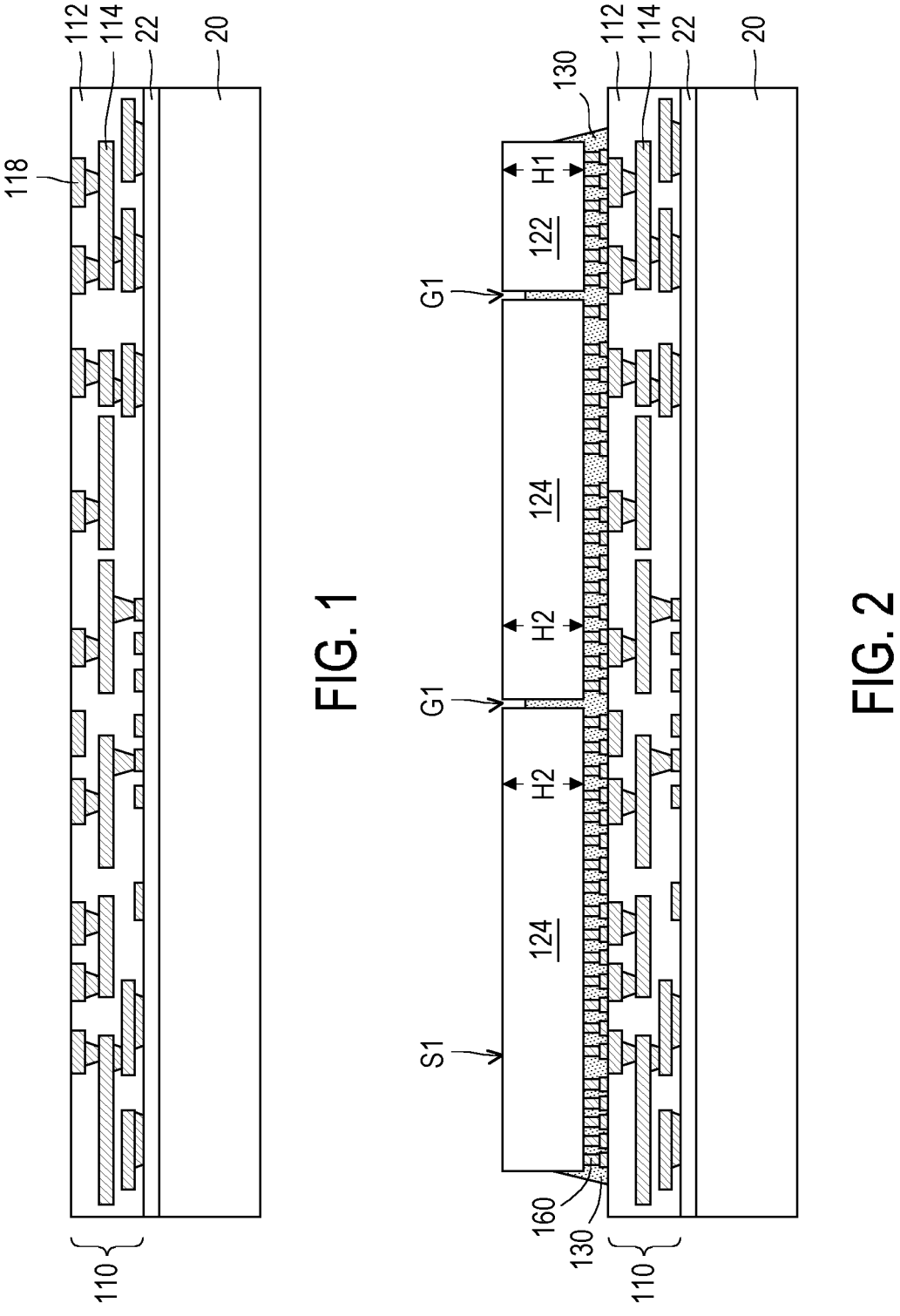
FIG. 1 to FIG. 10 illustrate cross sectional views of intermediate stages in the manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package with a conductive layer covering back surfaces of a plurality of dies and filling in a gap between the dies, and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

FIG. 1 to FIG. 10 illustrate cross sectional views of intermediate stages in the manufacturing of a semiconductor package according to some exemplary embodiments of the present disclosure. Referring to FIG. 1, in some embodiments, a carrier 20 and release layer 22 formed on the carrier 20. The carrier 20 may be a glass carrier, a silicon wafer, an organic carrier, or the like. In one embodiment, the carrier 20 may have a round top-view shape, and may have a size of a common silicon wafer. The release layer 22 may be formed of a polymer-based material (such as a Light to Heat Conversion (LTHC) material), which may be removed along with the carrier 20 from the overlying structures that will be formed in subsequent steps. In accordance with some embodiments of the present disclosure, the release layer 22 is formed of an epoxy-based thermal-release material. The release layer 22 may be coated onto the carrier 20. The top surface of the release layer 22 is leveled and has a high degree of co-planarity. In one embodiment, at least a dielectric layer or a passivation layer may be provided on a top surface of the carrier 20. The passivation layer may include organic materials, which may also be a photo-sensitive material such as polybenzoxazole (PBO), polyimide, benzocyclobutene (BCB), or the like, that may be easily patterned using a photo lithography process. Alternatively, the passivation layer may include a non-organic dielectric material such as silicon oxide, silicon nitride, silicon carbide, silicon oxynitride, or the like.

As shown in FIG. 1, subsequently, an interconnect structure 110 is formed over the carrier 20. In one embodiment, the interconnect structure 110 may be a redistribution layer (RDL) structure, which acts as a front-side (or chip-side) RDL interposer that is able to fan out the input/output (I/O) pads on a semiconductor die. The interconnect structure 110 may include at least one dielectric layer 112 and at least one metal layer 114. The formation of the metal layer 114 may include forming a seed layer (not shown) over the dielectric layer, forming a patterned mask (not shown) such as a photo resist over the seed layer, and then performing a metal plating on the exposed seed layer. The patterned mask and the portions of the seed layer covered by the patterned mask are then removed, leaving the metal layer 114 as in FIG. 1. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating. In some embodiments, the metal layer 114 may be formed of aluminum, copper, aluminum copper, nickel, or alloys thereof.

According to the embodiment, the dielectric layer 112 may include organic materials such as polyimide (PI) or inorganic materials such as silicon nitride, silicon oxide or the like, but not limited thereto. The metal layer 114 may include aluminum, copper, tungsten, titanium, titanium nitride, or the like. According to the illustrated embodiment, the metal layer 114 may include a plurality of fine-pitch traces, contact pads 118 exposed from a top surface of the dielectric layer 112. It is understood that the layers and layout of the metal layer 114 and the contact pads 118 are for illustration purposes only. Depending upon design requirements, more or less layers of metal layers and dielectric layers may be formed in the interconnect structure 110 in other embodiments.

In the present embodiment, the components over carrier 20, i.e. interconnect structure 110, are in combination referred to as an interposer. The interposer, different from conventional interposers that were formed based on silicon substrates, is formed based on dielectric layers 112. No silicon substrate is in the interposer, and hence interposer is referred to as an organic interposer, a silicon-substrate-free interposer or a Si-less interposer. Some through dielectric vias may be formed in dielectric layers 112 to replace conventional through-silicon vias. However, the disclosure is not limited thereto. In other embodiments, a silicon based interposer may also be applied.

With now reference to FIG. 2, a plurality of dies 122, 124 disposed on the interconnect structure 110 in a side-by-side manner. In accordance with some embodiments of the present disclosure, the dies 122, 124 may include a logic die (e.g., a Central Processing Unit (CPU) die, graphics processing unit (GPU) die, a Micro Control Unit (MCU) die, an input-output (IO) die, a BaseBand (BB) die, an Application processor (AP) die, a System-on-Chip (SoC), microcontroller, or the like), a memory die (e.g., dynamic random access memory (DRAM) die, static random access memory (SRAM) die, a hybrid memory cube (HMC) module, a high bandwidth memory (HBM) module, or the like), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The dies 122, 124 include semiconductor substrates, respectively, which may be silicon substrates. In some embodiments, the semiconductor substrate may include a bulk semiconductor substrate, semiconductor-on-insulator (SOI) substrate, multi-layered semiconductor substrate, or the like. The semiconductor material of the semiconductor substrate may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate may be doped or undoped. Devices, such as transistors, capacitors, resistors, diodes, and the like, may be formed in and/or on an active surface (e.g., the surface facing upward) of the semiconductor substrate.

In some embodiments, the dies 122, 124 may include interconnect structures, respectively, for connecting to the active devices and passive devices in dies 122, 124. Interconnect structures include metal lines and vias (not shown). The interconnect structure having one or more dielectric layer(s) and respective metallization pattern(s) is formed on the active surface of the semiconductor substrate. The dielectric layer(s) may be inter-metallization dielectric (IMD) layers. The IMD layers may be formed, for example, of a low-K dielectric material, such as undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spin coating, chemical vapor deposition (CVD), plasma-enhanced CVD (PECVD), high-density plasma chemical vapor deposition (HDP-CVD), or the like. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors such as conductive pillars or contact pads, are formed in and/or on the interconnect structure to provide an external electrical connection to the circuitry and devices. In addition, at least one of the dies 122, 124 may include Through-Silicon Vias (TSVs), sometimes referred to as through-semiconductor vias or through-vias, are formed to penetrate through semiconductor substrates, respectively, and are used to connect the devices and metal lines formed on the front side (the illustrated bottom side) of semiconductor substrates to the backside.

Figure 13:
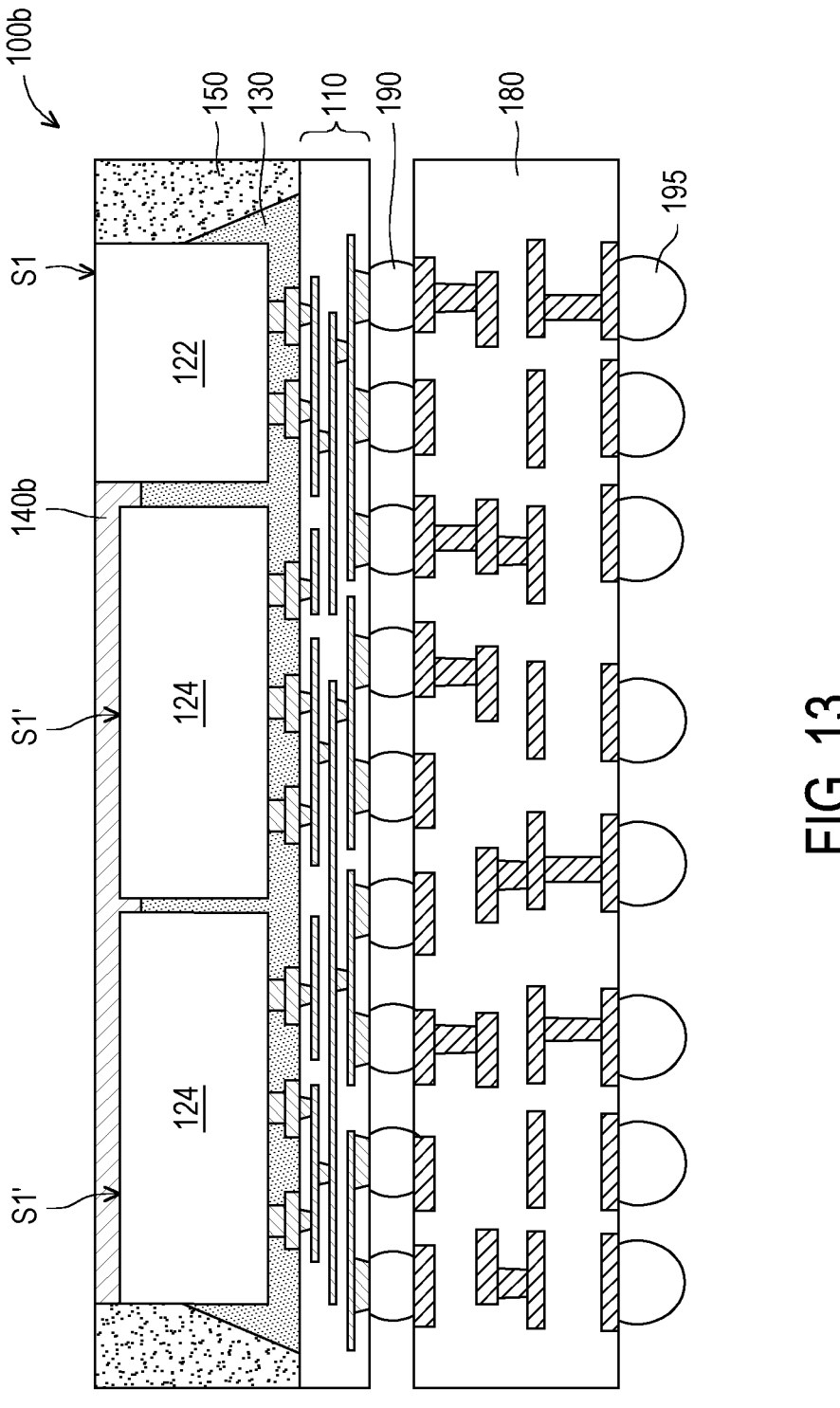

In some embodiments, the dies 122, 124 may include at least one first die 122 (one first die 122 are illustrated, but not limited thereto) and at least one second die 124 (two second dies 124 are illustrated, but not limited thereto). In one embodiment, the first die may be a memory die (e.g., dynamic random access memory (DRAM) die, static random access memory (SRAM) die, a hybrid memory cube (HMC) module, a high bandwidth memory (HBM) module, or the like), and the second die may be a logic die (e.g., a Central Processing Unit (CPU) die, graphics processing unit (GPU) die, a Micro Control Unit (MCU) die, an input-output (ID) die, a BaseBand (BB) die, an Application processor (AP) die, a System-on-Chip (SoC), microcontroller, etc.). In one embodiment, the first die may be a die stack (e.g., a memory stack) including a plurality of stacked dies, wherein TSVs (not shown) may be formed in dies to perform interconnection. In the present embodiment, a first height H1 of the first die 122 is substantially the same as a second height H2 of the second die 124 within process variations. However, in other embodiments, the first height H1 of the first die 122 may be higher than a second height H2 of the second die 124 as shown in FIG. 13, or vice versa.

In accordance with some embodiments of the present disclosure, the dies 122, 124 are bonded to the front side of the interconnect structure 110. In some embodiments, the resulting structure shown in FIG. 2 is a chip-on-wafer (CoW) package, although it should be appreciated that embodiments may be applied to other three-dimensional integrated circuit (3DIC) packages. The dies 122, 124 may be attached to the interconnect structure 110 using, for example, a pick-and-place tool.

In the embodiment shown, the dies 122, 124 are bonded to the interconnect structure 110 with connections that include conductive bumps (not shown), and conductive connectors 160. The conductive bumps are formed from a conductive material such as copper, aluminum, gold, nickel, palladium, the like, or combinations thereof and may be formed by sputtering, printing, electro plating, electroless plating, CVD, or the like. The conductive bumps may be solder-free and have substantially vertical sidewalls, and may be referred to as micro bumps. Some conductive bumps are electrically and physically connected to the interconnect structure of the interconnect structure 110, and some conductive bumps are electrically and physically connected to the interconnect structure of the dies 122, 124. The conductive connectors 160 bond the conductive bumps of the interconnect structure 110 and the conductive bumps of the dies 122, 124. The conductive connectors 160 may be formed from a conductive material such as solder, and may be formed by initially forming a layer of solder on the conductive bumps through methods such as evaporation, electroplating, printing, solder transfer, ball placement, or the like. Once the layer of solder has been formed, a reflow process may be performed in order to shape the conductive connectors 160 into desired bump shapes.

In some embodiments, an underfill 130 is filled between the dies 122, 124 and the interconnect structure 110, in accordance with some embodiments. The underfill 130 encapsulates and protects the bonding structures such as conductive bumps, conductive connectors 160, etc. In some embodiments, the underfill 130 is in direct contact with the bonding structures. In some embodiments, the underfill 130 extends laterally towards the conductive connectors 160. In accordance with some embodiments of the present disclosure, a lower part of a gap G1 between adjacent two of the dies (e.g., between dies 124, or between die 122 and die 124). That is, a part from filling the space between the dies 122, 124 and the interconnect structure 110, the underfill 130 may also extends upward and fill a lower part of the gap G1 between the dies 122, 124. In other words, the underfill 130 may covers a lower part of the side surfaces of the dies 122, 124. In some embodiments, the underfill 130 has fillets at edge regions of the interconnect structure 110. The fillets extend up along side surfaces of the dies 122, 124. In some embodiments, the underfill 130 is made of or includes a polymer material. The underfill 130 may include an epoxy-based resin. In some embodiments, the underfill 130 includes fillers dispersed in the epoxy-based resin. In some embodiments, the formation of the underfill 130 involves an injecting process, a spin-on process, a dispensing process, a film lamination process, an application process, one or more other applicable processes, or a combination thereof. In some embodiments, a thermal curing process is used during the formation of the underfill 130.

In other embodiments, the dies 122, 124 may be bonded to the interconnect structure 110 by face-to-face bonding such as hybrid bonding, fusion bonding, direct bonding, dielectric bonding, metal bonding, or the like. Further, a mix of bonding techniques could be used, e.g., some of the dies 122, 124 could be bonded to the interconnect structure 110 by conductive connectors 160, and other dies 122, 124 could be bonded to the interconnect structure 110 by face-to-face bonding. The bonding may be achieved through hybrid bonding. For example, bond pads of the dies 122, 124 may be bonded to bond pads of the interconnect structure 110 through metal-to-metal direct bonding. In accordance with some embodiments of the present disclosure, the metal-to-metal direct bonding is copper-to-copper direct bonding. Furthermore, dielectric layers of the dies 122, 124 may be bonded to dielectric layer of the interconnect structure 110, for example, with Si—O—Si bonds generated. The hybrid bonding may include a pre-bonding and an anneal, so that the metals in bond pads inter-diffuse with the metals in the respective underlying bond pads.

Figure 3:
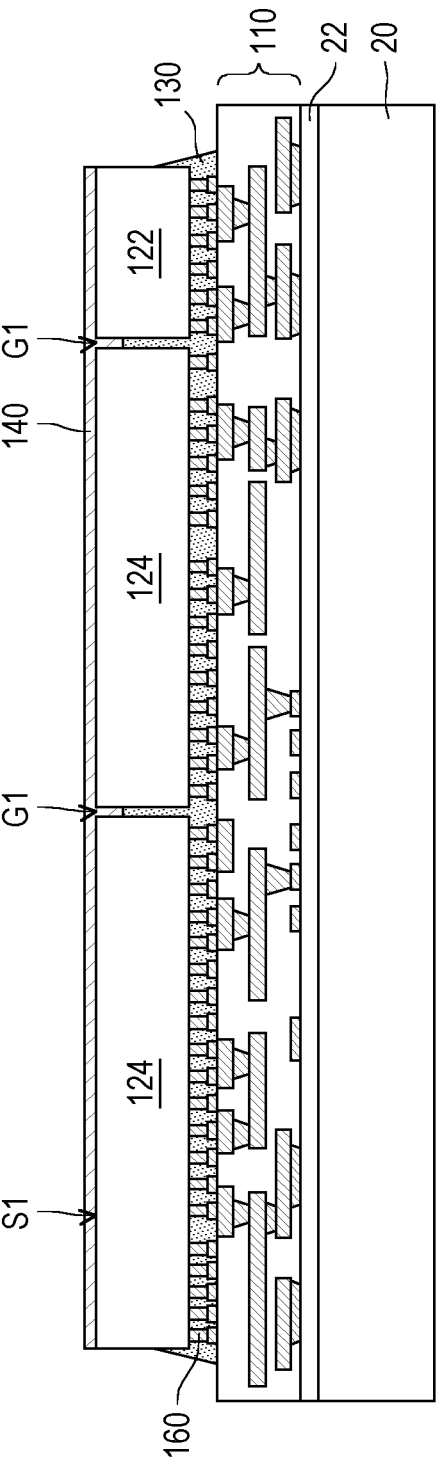

With now reference to FIG. 3, in some embodiments, a conductive layer 140 fills an upper part of the gap G1 between the dies 122, 124, and at least covers back surfaces of the adjacent two of the dies 122, 124. In one embodiment, the conductive layer 140 is formed over the dies 122, 124 to substantially fill the gaps G1 between the dies 122, 124. In some embodiments, the conductive layer 140 can extend over dies 122, 124. In other words, the conductive layer 140 covers the back surface Si of each of the dies 122, 124, and fills the upper parts of the gaps G1 that are not filled by the underfill 130. That is, the gaps G1 between the dies 122, 124 are filled by the underfill 130 and the conductive layer 140. In some embodiments, the conductive layer 140 may be provided by printing, dispensing, spin coating, or the like. For example, the conductive layer 140 includes a Sn paste, solder, pre-solder, aluminum, silver, any alloy or combination thereof, or other suitable conductive material. In some embodiments, a coefficient of thermal expansion (CTE) of the conductive layer 140 is greater than a CTE of an encapsulating material (e.g., the encapsulating material 150 shown in FIG. 4) that is applied subsequently for encapsulating the dies 122, 124.

In general, the CTE of the encapsulating material (e.g., the encapsulating material 150 shown in FIG. 4) is much lower than the CTE of the underfill 130. For example, CTE of the encapsulating material 150 is lower than or substantially equal to about 20 $(10^{-6}/k)$, and the CTE of underfill 130 is higher than or substantially equal to about 90 $(10^{-6}/k)$. Therefore, if the encapsulating material 150 is filled in the gap G1 and in contact with the underfill 130, the CTE mismatch between materials of the underfill 130 and the encapsulating material 150 would cause great thermal stress, which may result in delamination on interface between the encapsulating material 150 and the underfill 130.

Accordingly, in the present disclosure, the gap G1 is filled by the underfill 130 and the conductive layer 140, so the gap G1 is free of the encapsulating material 150. The CTE of the conductive layer 140 is greater than the CTE of the encapsulating material 150. For example, the CTE of the conductive layer 140 is greater than or substantially equal to about 30 $(10^{-6}/k)$, which is closer to the CTE of the underfill 130. Therefore, CTE mismatch between materials of the underfill 130 and the encapsulating material 150 can be reduced, so as to reduce risk of delamination on interfaces and improve the reliability of the semiconductor package. In addition, the heat conductivity of the conductive layer 140 is higher than the heat conductivity of the encapsulating material 150, so as to further improve the heat dissipation efficiency of the semiconductor package.

Figure 4:
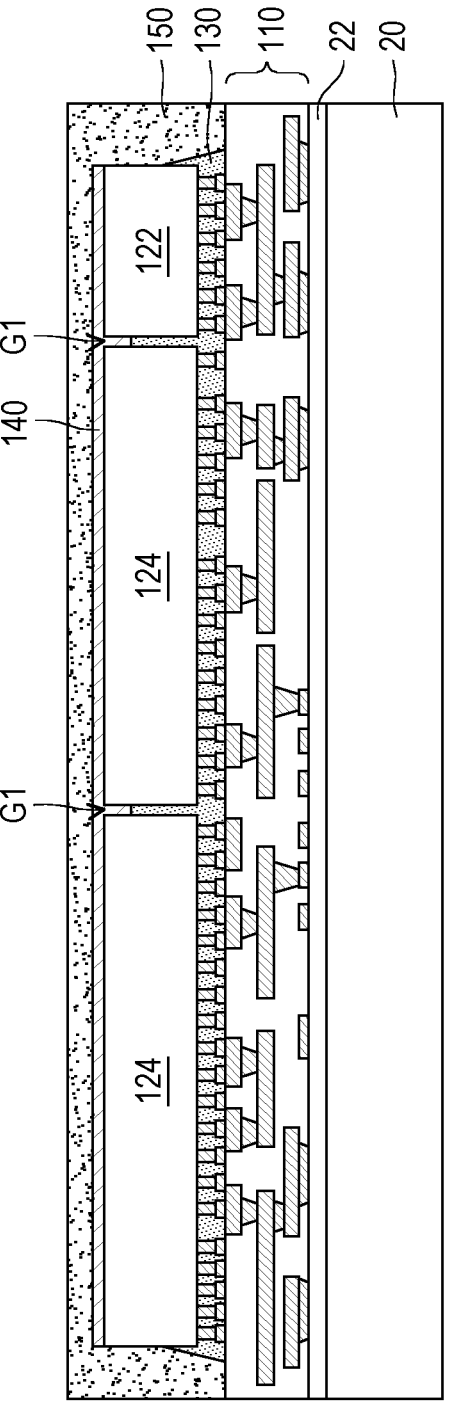

Then, referring to FIG. 4, an encapsulating material 150 is formed over the interconnect structure 110 and encapsulates the various components. In some embodiments, the encapsulating material 150 encapsulates the dies 122, 124 and the conductive layer 140. The encapsulating material 150 may be a molding compound, epoxy, or the like, and may be applied by compression molding, transfer molding, or the like. The encapsulating material 150 may be formed over the interconnect structure 110 such that the die 122, 124, the conductive layer 140 and the underfill 130 are buried or covered. The encapsulating material 150 is then cured. With such arrangement, the conductive layer 140 at least partially fills the gaps G1 between the dies 122, 124, and prevent the encapsulating material 150 from filling the gaps G1, so as to reduce the CTE mismatch between materials and reduce risk of delamination on interfaces, such that the reliability of the semiconductor package can be improved.

Figure 5:
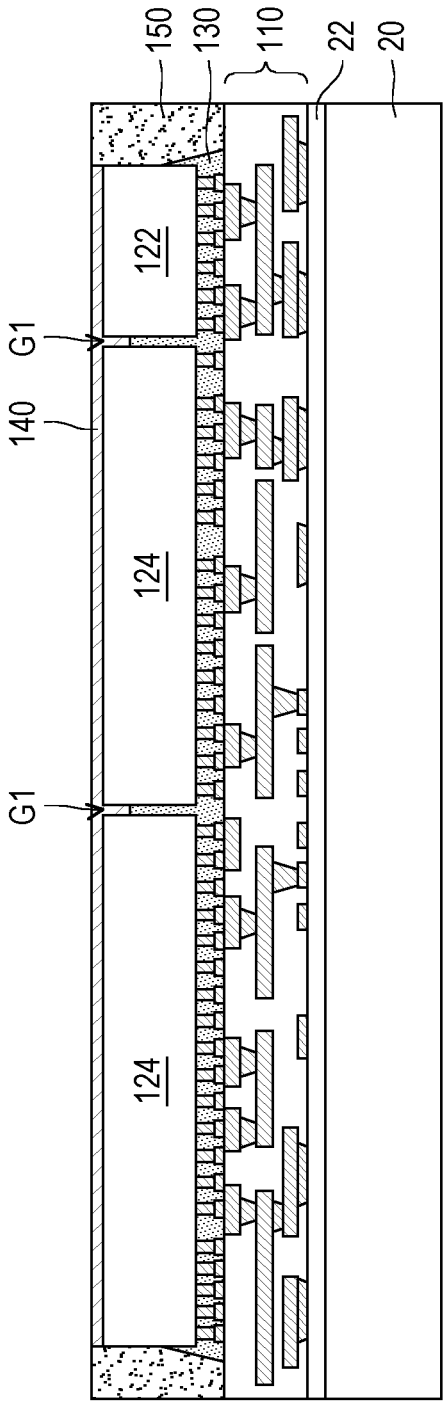

Then, referring to FIG. 5, a thinning process is performed on the encapsulating material 150 till the conductive layer 140 is revealed. In some embodiments, the encapsulating material 150 is thinned such that upper surfaces of the encapsulating material 150 and the conductive layer 140 are level. In accordance with some embodiments of the disclosure, the thinning process can be done by a CMP process, grinding, etching, or other suitable process. After the thinning process, in some embodiments, an upper surface of the upper surfaces of the encapsulating material 150 and an upper surface of the conductive layer 140 are substantially co-planar within process variations. In other words, the encapsulating material 150 laterally encapsulates the dies 122, 124 and the conductive layer 140, and exposes the upper surface of the conductive layer 140.

Figure 11:
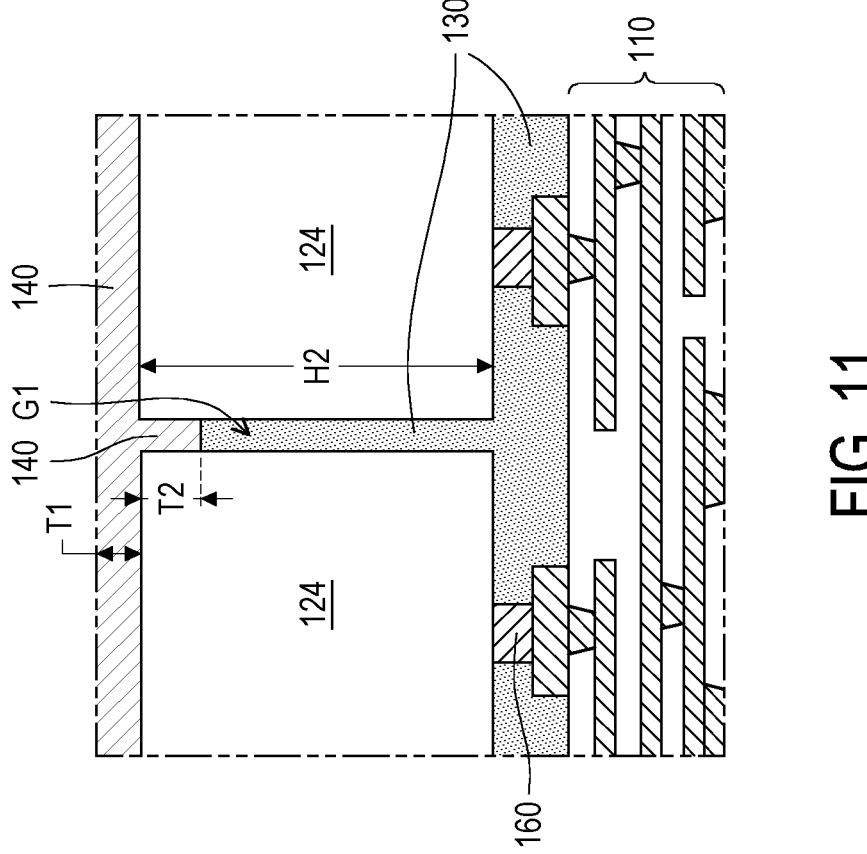
FIG. 11 illustrates a partial enlarged view of a semiconductor package according to different exemplary embodiments of the present disclosure.

FIG. 11 illustrates a partial enlarged view of a semiconductor package according to different exemplary embodiments of the present disclosure. Referring to FIG. 3 and FIG. 11, in accordance with some embodiments of the disclosure, after the thinning process, a thickness T1 of the conductive layer 140 over the back surface of each die 122, 124 may range from 0.5 μm to 20 μm (i.e., 0.5 μm≤T1≤20 μm). In one embodiment, a ratio of a height H1 or H2 (height H2 is illustrated, but not limited thereto) of one of the two adjacent dies 122/124 to a thickness T2 of the upper part of the gap G1 ranges from 1 to 100 (i.e., 1≤H2/T2, or H1/T2≤100). In one embodiment, a ratio of a thickness T1 of the conductive layer 140 over the back surface of each die 122, 124 to a thickness T2 of the upper part of the gap G1 ranges from 0.1 to 10 (i.e., 0.1≤T1/T2≤10). With such arrangement, the conductive layer 140 at least partially fills the gaps G1 between the dies 122, 124, and prevent the encapsulating material 150 from filling the gaps G1, so as to reduce the CTE mismatch between materials and reduce risk of delamination on interfaces, such that the reliability of the semiconductor package can be improved. In addition, with the conductive layer 140 at least covering the back surfaces of the dies 122, 124, heat dissipation efficiency of the semiconductor package is also improved.

Figure 6:
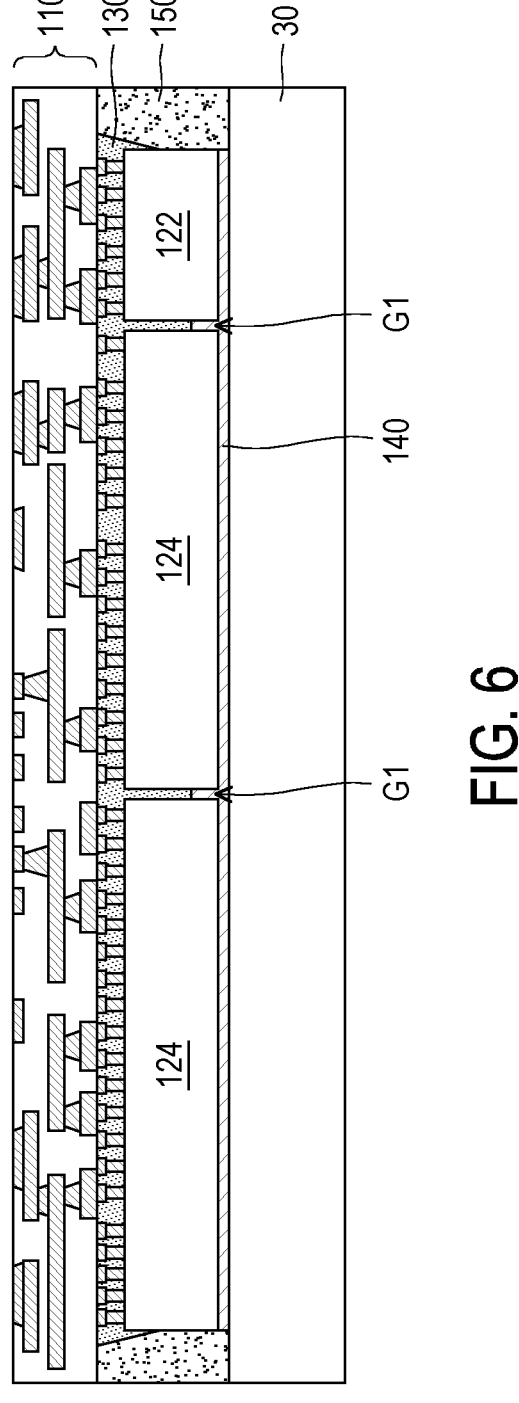

Referring to FIG. 5 and FIG. 6, in some embodiments, a de-bonding process is performed on the carrier 20 to remove (de-bond) the carrier 20 from the back side of the interconnect structure 110. In accordance with some embodiments, the de-bonding includes projecting a light such as a laser light or an ultraviolet (UV) light on the release layer 22 so that the release layer 22 decomposes under the heat of the light and the carrier can be removed. In some embodiments, the carrier 20 may also be removed using a grinding process, a thermal process, one or more other applicable processes, or a combination thereof. Then, the intermediate structure (the structure shown in FIG. 5 without the carrier 20) is then flipped over to prepare for processing of the back side of the interconnect structure 110. For example, the intermediate structure may be placed on a carrier substrate 30 or other suitable support structure for subsequent processing. For example, the carrier substrate 30 may be attached to the encapsulating material 150 and the conductive layer 140. The intermediate structure may be attached to the carrier substrate by a release layer. In some embodiments, the release layer may be formed of a polymer-based material, which may be removed along with the carrier substrate 30 from the overlying structures. In some embodiments, the carrier substrate 30 is a substrate such as a bulk semiconductor or a glass substrate, and may have any thickness. In some embodiments, the release layer is an epoxy-based thermal-release material, which loses its adhesive property when heated, such as a light-to-heat-conversion (LTHC) release coating.

Figure 7:
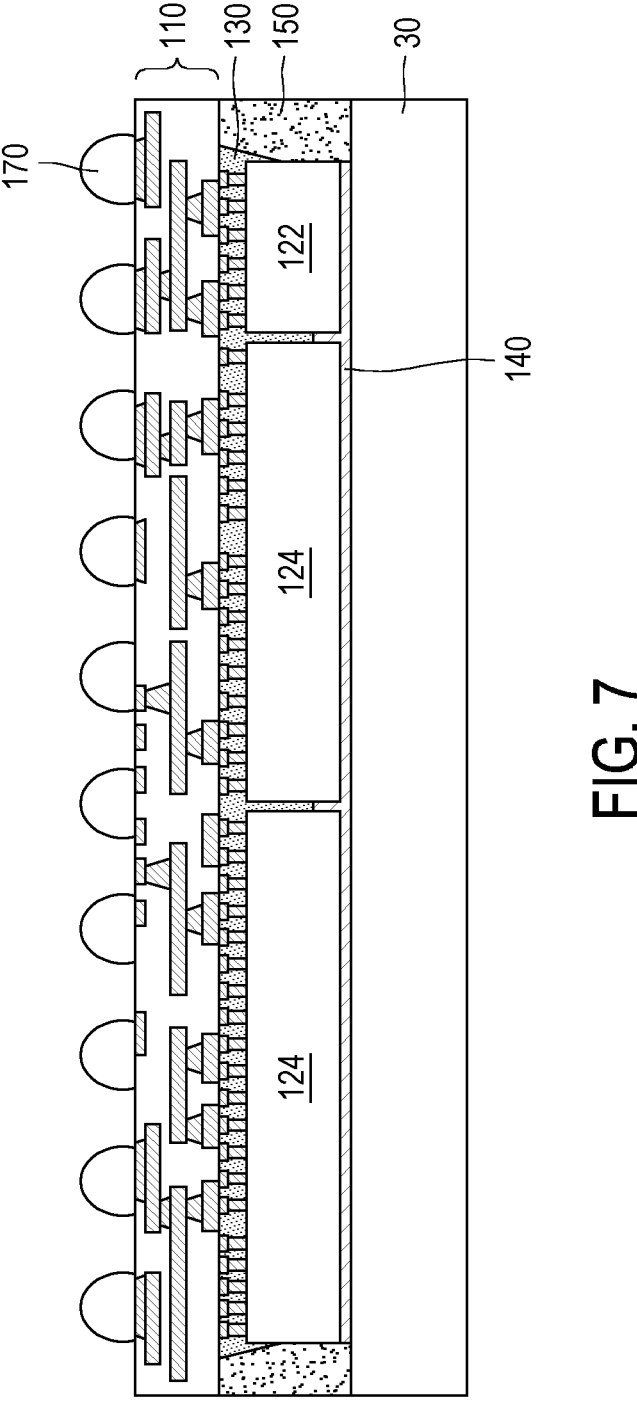

Referring to FIG. 7, in some embodiments, a plurality of conductive connectors 170 are formed on the back side of the interconnect structure 110. The conductive connectors 170 may be formed from a conductive material such as solder, and may be formed by initially forming a layer of solder on the conductive bumps of the interconnect structure 110 through methods such as evaporation, electroplating, printing, solder transfer, ball placement, or the like. Once the layer of solder has been formed, a reflow process may be performed in order to shape the conductive connectors 170 into desired bump shapes. The conductive connectors 170 may be ball grid array (BGA) connectors, solder balls, controlled collapse chip connection (C4) bumps, or the like.

Figure 8:
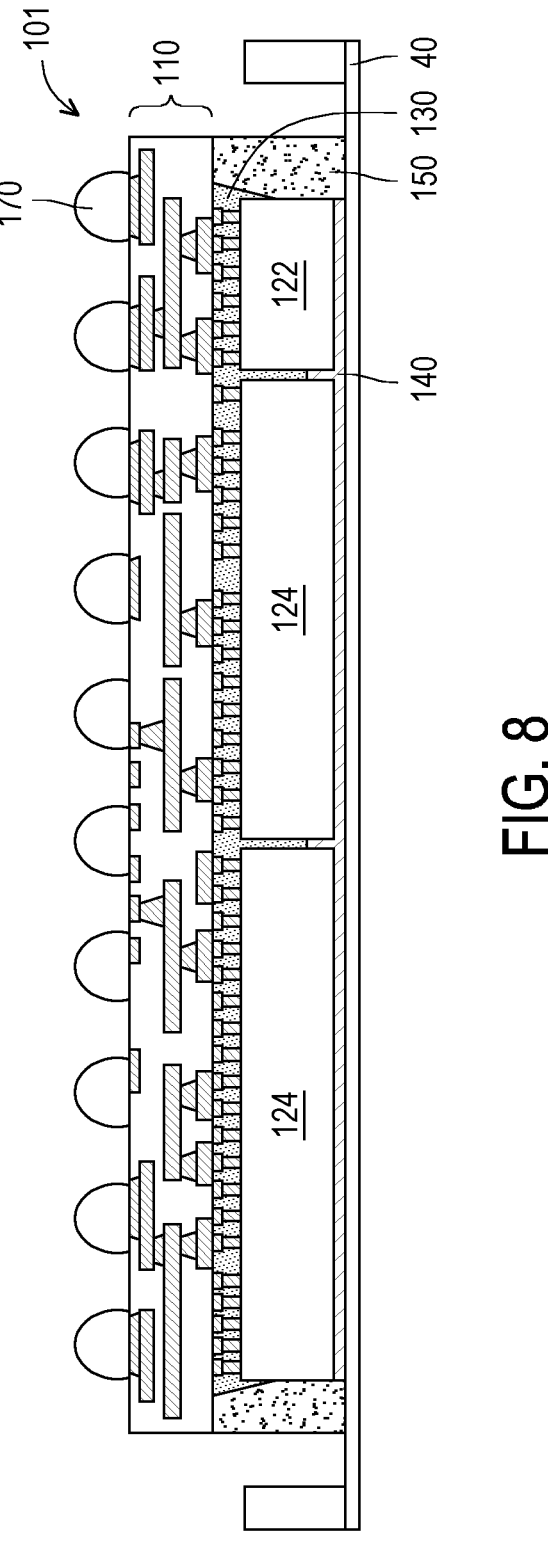

Referring to FIG. 7 and FIG. 8, after the formation of the conductive connectors 170, the intermediate structure (the structure shown in FIG. 7 without the carrier substrate is then is demounted from carrier substrate 30. Then, as shown in FIG. 8, the intermediate structure, which is in a wafer form, is sawed apart, so that a plurality of packages (one of the packages 101 is illustrated herein) are formed. In some embodiments, in order to saw the intermediate structure, the intermediate structure is attached on a dicing tape 40, and is diced when attached to dicing tape 40. The interconnect structure 110, the dies 122, 124, the underfill 130, the conductive layer 140, and the encapsulating material 150 (and other attached devices) are in combination referred to as packages 101.

Figure 9:
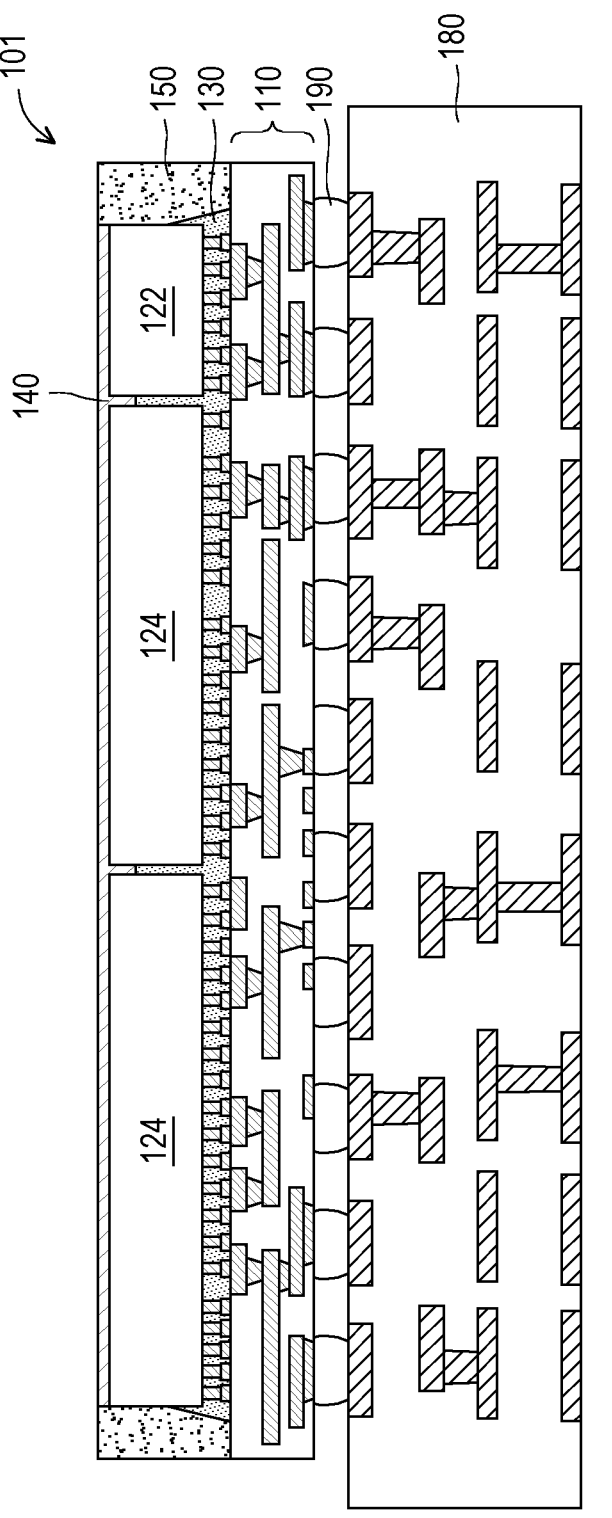

Referring to FIG. 9, the packages 101 (one package 101 is illustrated) are then detached from dicing tape 40, and the package 101 can be mounted onto a substrate 180 through a plurality of conductive connectors 190. The substrate 180 may be a package substrate, an interposer, a printed circuit board (PCB), or the like. In some embodiments, the substrate 180 includes metal traces and/or vias that interconnect the electrical connectors (such as metal pads (not shown) and/or conductive connectors) on the opposite sides of the substrate 180. Discrete passive devices (not shown) such as resistors, capacitors, transformers, and the like, may also be bonded to the substrate 180.

Figure 10:
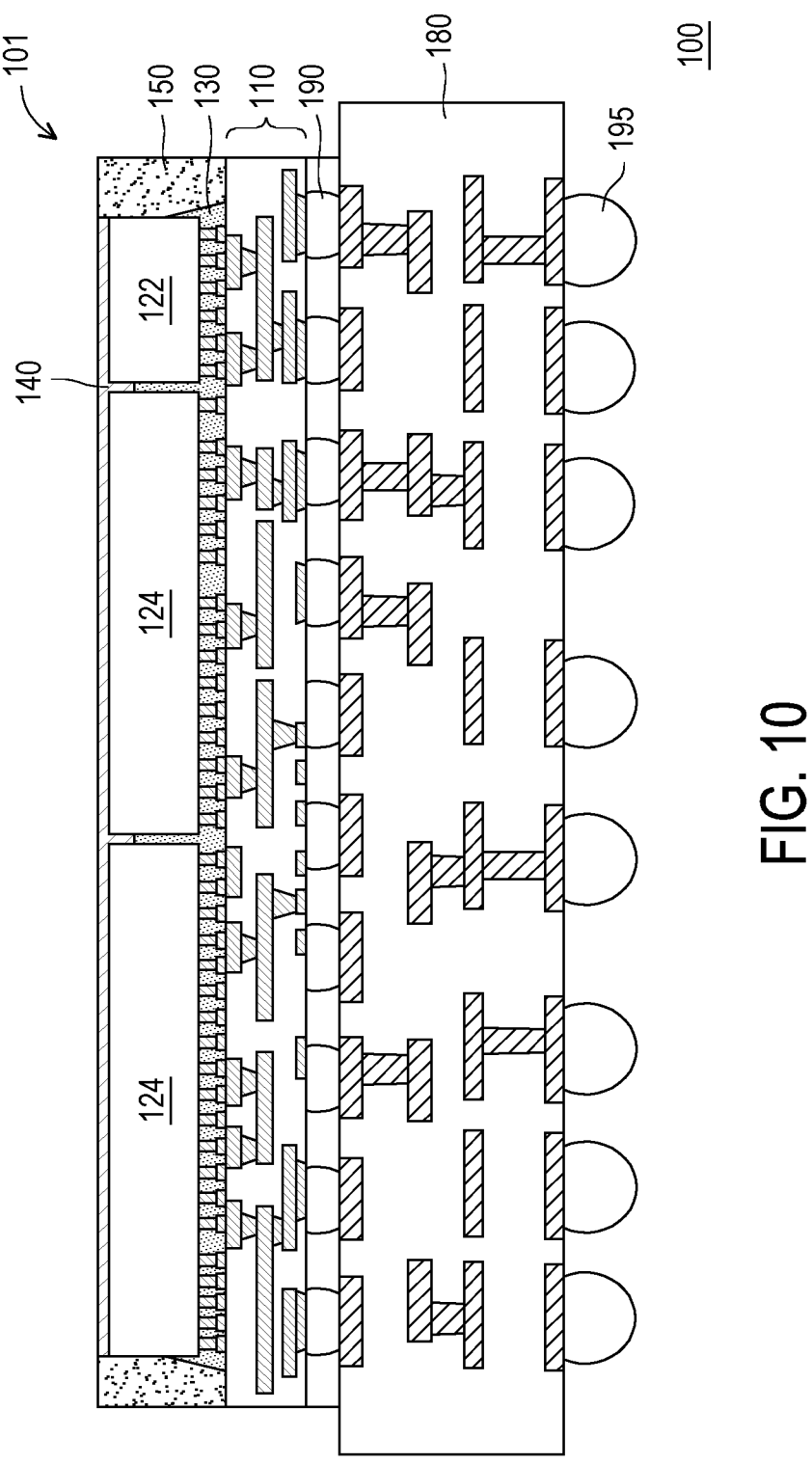

Then, referring to FIG. 10, in some embodiments, the conductive connectors 195 are attached to the substrate 180. At the time, a semiconductor package 100 may be substantially formed. In some embodiments, the package 101 and the conductive connectors 195 are on the opposite sides of the substrate 180. The package 101 and substrate 180 (and other attached devices) are in combination referred to as semiconductor package 100.

Figure 12:
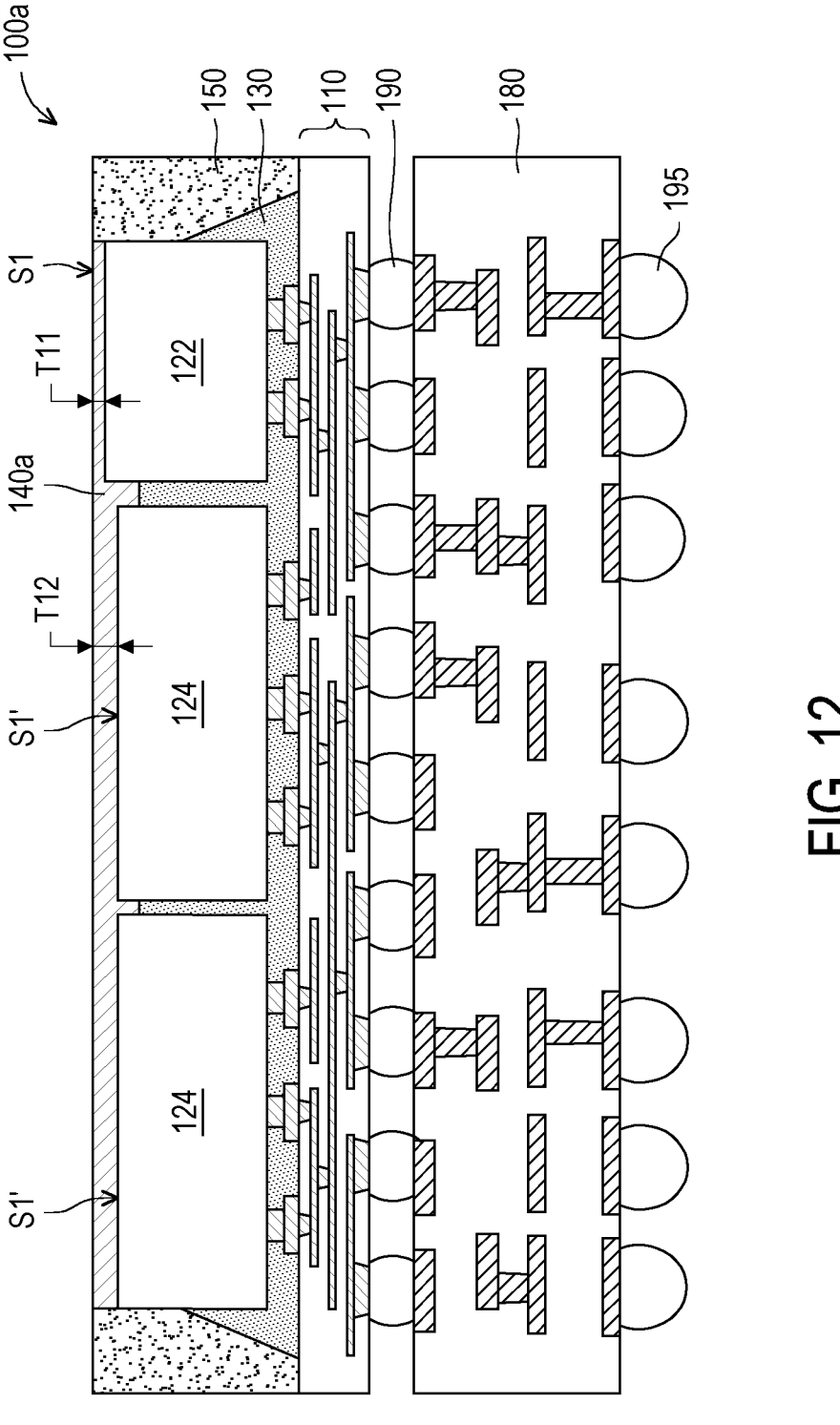
FIG. 12 to FIG. 14 illustrate cross sectional views of different semiconductor packages according to some exemplary embodiments of the present disclosure.
Figure 14:
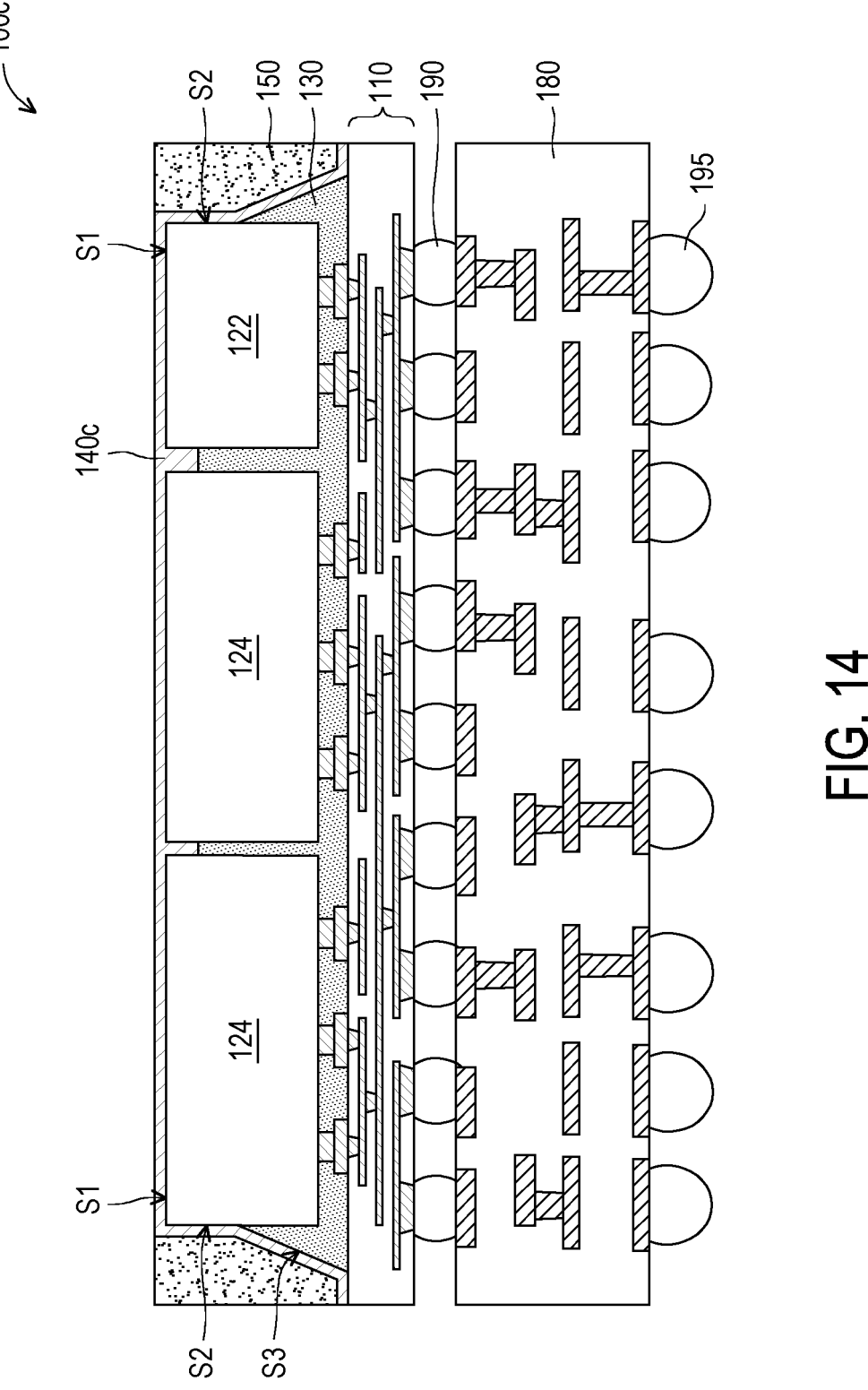

FIG. 12 to FIG. 14 illustrate cross sectional views of different semiconductor packages according to some exemplary embodiments of the present disclosure. It is noted that the semiconductor package 100a shown in FIG. 12 contains many features same as or similar to the semiconductor package 100 in the previous embodiment. For purpose of clarity and simplicity, detail description of same or similar features may be omitted, and the same or similar reference numbers denote the same or like components. The main differences between the semiconductor package 100a shown in FIG. 12 and the semiconductor package 100 in the previous embodiment are described as follows.

Referring to FIG. 12, in some embodiments, the heights H1, H2 of the dies 122, 124 are different from one another. For example, in the present embodiment, a first height H1 of the first die 122 is higher than a second height H2 of the second die 124. In the present embodiment, the conductive layer 140*a* covers the back surface of each of the die 122, 124. That is, the conductive layer 140*a* covers the back surface S1 of the first die 122, and the back surfaces S1' of the second die 124, and an upper surface of the conductive layer 140*a* remains a flat surface (within process variations). Accordingly, a thickness T11 of the conductive layer 140*a* over the back surface Si of the first die 122 is substantially thinner than a thickness T12 of the conductive layer 140*a* over the back surface S1' of the second die 124.

With now reference to FIG. 13, it is noted that the semiconductor package 100*b* shown in FIG. 13 contains many features same as or similar to the semiconductor package 100 in the previous embodiment. For purpose of clarity and simplicity, detail description of same or similar features may be omitted, and the same or similar reference numbers denote the same or like components. The main differences between the semiconductor package 100*b* shown in FIG. 13 and the semiconductor package 100 in the previous embodiment are described as follows.

In the present embodiments, the heights H1, H2 of the dies 122, 124 are different from one another. For example, in the present embodiment, a first height H1 of the first die 122 is higher than a second height H2 of the second die 124. In the present embodiment, the conductive layer 140*b* covers the back surface S1' of the second die 124, and the back surface S1 of the first die 122 is free of the conductive layer 140*b*. That is, the conductive layer 140*a* covers the back surface S1' of the second die 124 and exposes the back surface S1 of the first die 122, and an upper surface of the conductive layer 140*b* is level with the back surface S1 of the first die 122. The structure shown in FIG. 13 can be achieved by performing a thinner process on the structure shown in FIG. 12 till the back surface Si of the first die 122 is exposed. The thinner process can be done by a scraping process, CMP process, grinding, etching, or other suitable process.

With now reference to FIG. 14, it is noted that the semiconductor package 100*c* shown in FIG. 14 contains many features same as or similar to the semiconductor package 100 in the previous embodiment. For purpose of clarity and simplicity, detail description of same or similar features may be omitted, and the same or similar reference numbers denote the same or like components. The main differences between the semiconductor package 100*c* shown in FIG. 14 and the semiconductor package 100 in the previous embodiment are described as follows.

Referring to FIG. 14, in some embodiments, the conductive layer 140*c* covers side surfaces S2 of each of the dies 122, 124 and an outer surface S3 of the underfill 130. In detail, the conductive layer 140*c* not only fills the upper part of the gap G1 and covers the back surfaces S1 of the dies 122, 124, but also covers the outermost side surfaces S2 (e.g., the side surfaces S2 located along the edge regions of the interconnect structure 110) of the dies 122, 124, the outer surface S3 of the underfill 130 (e.g., the fillet of the underfill 130 at edge regions of the interconnect structure 110). In some embodiments, the conductive layer 140*d* further covers an upper surface of the interconnect structure 110 at the edge regions. In some embodiment, the conductive layer 140 may be formed from conductive material such as Sn paste, solder, pre-solder, aluminum, silver, any alloy or combination thereof, or other suitable conductive material, and may be formed by printing, dispensing, spin coating, or the like. In other embodiments, the conductive layer 140 may also be formed from conductive material such as copper, aluminum, gold, nickel, palladium, the like, or combinations thereof and may be formed by sputtering, printing, electro plating, electroless plating, CVD, or the like. In the embodiment, the heights of the dies 122, 124 are substantially the same within process variation. However, in other embodiments, the heights of the dies 122, 124 may be different from one another. An upper surface of the conductive layer 140*c* that faces away from the interconnect structure 110 is substantially a flat surface. Accordingly, by increasing the covering region of the conductive layer 140*c*, the heat dissipation efficiency can be further improved.

Figure 15:
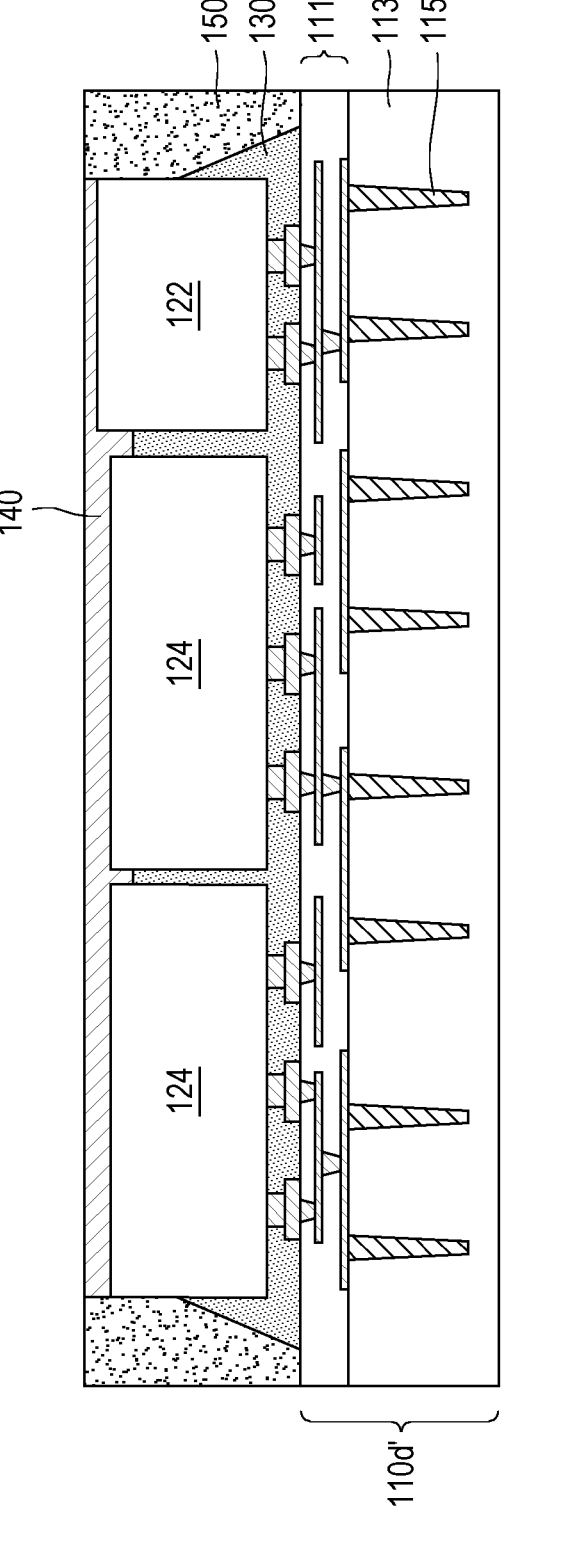
FIG. 15 and FIG. 16 illustrate cross sectional views of intermediate stages in the manufacturing of a semiconductor package according to some exemplary embodiments of the present disclosure.
Figure 16:
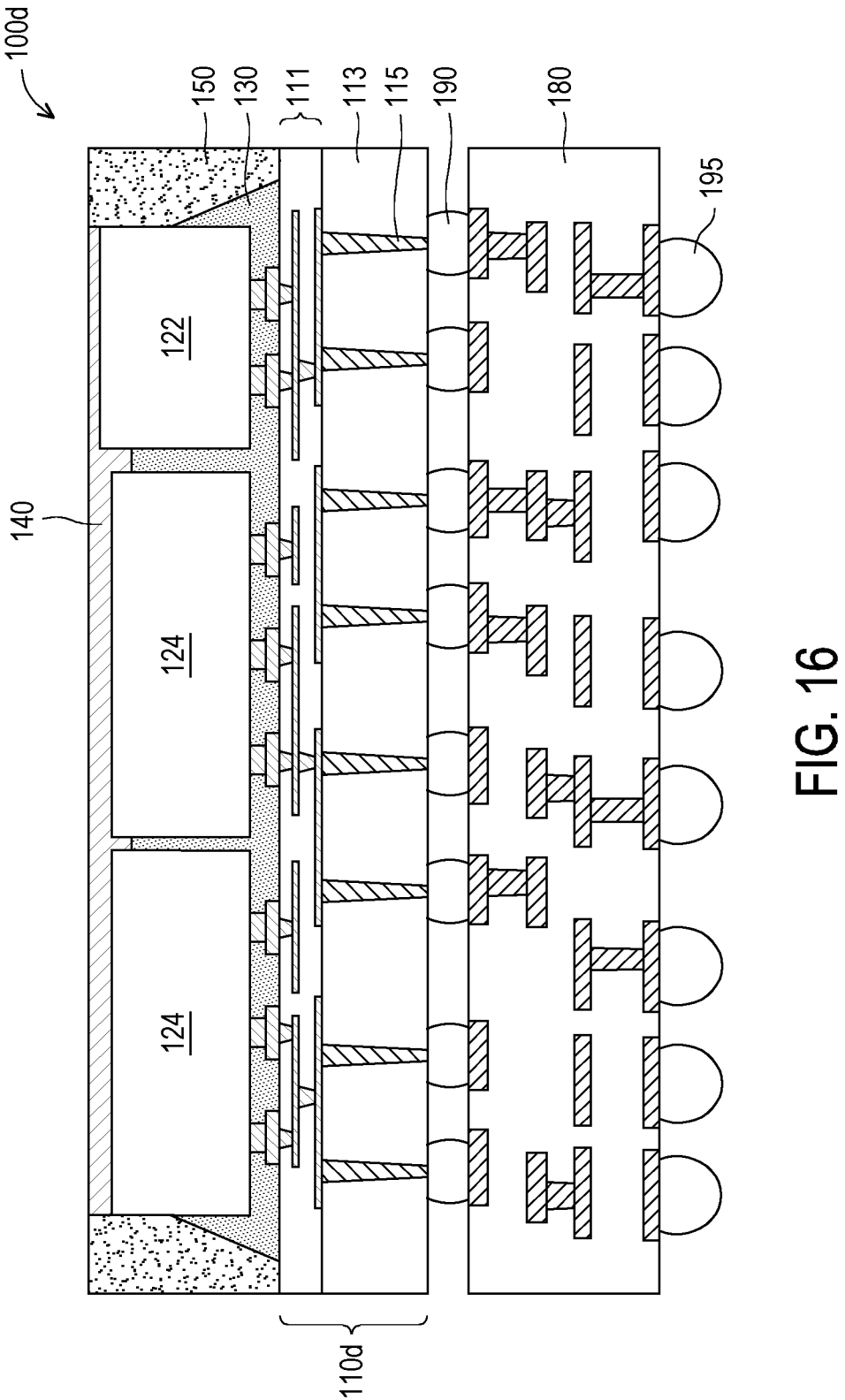

FIG. 15 and FIG. 16 illustrate cross sectional views of intermediate stages in the manufacturing of a semiconductor package according to some exemplary embodiments of the present disclosure. It is noted that the semiconductor package 100*d* shown in FIG. 15 and FIG. 16 contains many features same as or similar to the semiconductor package 100 in the previous embodiment. For purpose of clarity and simplicity, detail description of same or similar features may be omitted, and the same or similar reference numbers denote the same or like components. The main differences between the semiconductor package 100*d* shown in FIG. 15 and FIG. 16 and the semiconductor package 100 in the previous embodiment are described as follows.

With now reference to FIG. 15 and FIG. 16, in the previous embodiments, the package is formed based on dielectric layers. No silicon substrate is in the interconnect structure 110, and hence interconnect structure 110 can be referred to as an organic interposer, a silicon-substrate-free interposer or a Si-less interposer. In the present embodiment, the package 100*d* may be formed based on a silicon based interconnect structure (interposer) 110*d*. In some embodiments, the interconnect structure 110*d* may be an interposer with through substrate vias (TSVs) 115. The manufacturing process of the interconnect structure 110*d* may include the following steps. In this embodiment, an interposer 110*d'* is provided. The interposer 110*d'* includes a substrate 113', e.g., a silicon substrate, doped or undoped, or an active layer of a silicon-on-insulator (SOI) substrate. However, the substrate 113 may alternatively be a glass substrate, a ceramic substrate, a polymer substrate, or any other substrate that may provide a suitable protection and/or interconnection functionality. These and any other suitable materials may alternatively be used for the substrate 113.

In some embodiments, the substrate 113' may include electrical elements, such as resistors, capacitors, signal distribution circuitry, combinations of these, or the like. These electrical elements may be active, passive, or a combination thereof. In other embodiments, the substrate 113' is free from both active and passive electrical elements therein. All such combinations are fully intended to be included within the scope of the embodiments.

The TSVs 115 shown in FIG. 16 may be formed by initially forming TSV conductors (e.g., buried vias) 115' partially through the substrate 113' as it is shown in FIG. 15. The TSV conductors 115' may be formed by applying and developing a suitable photoresist to the substrate 113 and then etching the substrate 113' to generate TSV openings (filled later as discussed below). The openings for the TSV conductors 115' at this stage may be formed so as to extend into the substrate 113' to a depth at least greater than the eventual desired height of the finished substrate 113'. Accordingly, while the depth is dependent upon the overall design of the interposer 110*d*, the depth may be between about 1 μm and about 700 μm below the surface on the substrate 113', with a depth of about 50 μm.

Once the openings for the TSV conductors 115' have been formed, the openings for the TSV conductors may be filled with, e.g., a liner (not separately illustrated in FIG. 14), a barrier layer (also not separately illustrated in FIG. 14), and a conductive material. The conductive material may comprise copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the openings for the TSV conductors. Once the openings for the TSV conductors have been filled, excess barrier layer and excess conductive material outside of the openings for the TSV conductors may be removed through a grinding process such as chemical mechanical polishing (CMP), although any suitable removal process may be used.

Once the TSV conductors 115' have been formed, a redistribution structure 111 may be formed on a first side of the substrate 113' in order to provide interconnectivity. The redistribution structure 111 may be formed using common methods for forming interconnect lines in integrated circuits. In an embodiment the redistribution structure 111 includes at least one conductive layer formed of a metal such as aluminum, copper, tungsten, titanium, and combinations thereof. The at least one conductive layer may be formed by forming a seed layer, covering the seed layer with a patterned photoresist (not illustrated), and then plating the metal on the seed layer within the openings of the photoresist. Once completed, the photoresist and portions of the seed layer underlying the photoresist are removed, leaving the at least one conductive layer.

Once ready, the processes illustrated in FIG. 2 to FIG. 5 are then performed over the interposer 110d' to form the resulting structure shown in FIG. 15. Then, the substrate 113' may be further processed to form the interposer 110d. In an embodiment the substrate 113' is thinned in order to expose the TSV conductors 113' and form TSVs 113 that extend through the substrate 113. The thinning of the second side of the substrate 113 may be performed by a combination of grinding, chemical mechanical polishing (CMP) and/or etching, etc. Then, a second redistribution structure may be formed on the second side of the substrate 113, and a plurality of conductive connectors 190 may be formed to provide conductive regions for contact and the interposer 110d may be substantially formed.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes an interconnect structure, a plurality of dies disposed on the interconnect structure in a side-by-side manner, an underfill filling between the interconnect structure and the plurality of dies and filling a lower part of a gap between adjacent two of the plurality of dies, a conductive layer at least covering back surfaces of the adjacent two of the plurality of dies and filling an upper part of the gap, and an encapsulating material laterally encapsulating the plurality of dies and the conductive layer.

In accordance with some embodiments of the disclosure, a semiconductor package includes a substrate, an interconnect structure disposed over the substrate, a first die and a second die disposed over the interconnect structure in a side-by-side manner, a conductive layer at least covering at least a back surface of the first die or the second die and filling in a gap between the first die and the second die, and an encapsulating material laterally encapsulating the first die, a second die and the conductive layer.

In accordance with some embodiments of the disclosure, a manufacturing method of a semiconductor package includes the following steps. An interconnect structure is provided over a carrier. A plurality of dies are provided over the interconnect structure in a side by side manner. A conductive layer is provided over back surfaces of the adjacent two of the plurality of dies and filling an upper part of a gap. An encapsulating material is provided over the interconnect structure for encapsulating the plurality of dies and the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an interconnect structure;
a plurality of dies disposed on the interconnect structure in a side-by-side manner;
an underfill filling between the interconnect structure and the plurality of dies and filling a lower part of a gap between adjacent two of the plurality of dies;
a conductive layer at least covering back surfaces of the adjacent two of the plurality of dies and filling an upper part of the gap; and
an encapsulating material laterally encapsulating the plurality of dies and the conductive layer, wherein the gap between the adjacent two of the plurality of dies is free of encapsulating material.

2. The semiconductor package as claimed in claim 1, wherein the conductive layer covers a back surface of each of the plurality of dies.

3. The semiconductor package as claimed in claim 1, wherein the conductive layer covers side surfaces of each of the plurality of dies.

4. The semiconductor package as claimed in claim 1, wherein the conductive layer covers an outer surface of the underfill.

5. The semiconductor package as claimed in claim 1, wherein the plurality of dies comprises a first die and a second die, a first height of the first die is higher than a second height of the second die.

6. The semiconductor package as claimed in claim 5, wherein the conductive layer covers a second back surface of the second die, and a first back surface of the first die is free of the conductive layer.

7. The semiconductor package as claimed in claim 1, wherein the conductive layer comprising a first part covering a back surface of each of the plurality of dies, and a second part filling the upper part of the gap, wherein an upper surface of the first part is substantially coplanar with an upper surface of the second part.

8. The semiconductor package as claimed in claim 1, wherein a ratio of a height of one of the adjacent two of the plurality of dies to a thickness of the upper part of the gap ranges from 1 to 100.

9. The semiconductor package as claimed in claim 1, wherein a coefficient of thermal expansion of the conductive layer is greater than a coefficient of thermal expansion of the encapsulating material.

10. A semiconductor package, comprising:

a substrate;

an interconnect structure disposed over the substrate;

a first die and a second die disposed over the interconnect structure in a side-by-side manner;

an underfill filling a lower part of a gap between the first die and the second die;

a conductive layer covering at least a back surface of the first die or the second die and filling in an upper part of the gap; and an encapsulating material laterally encapsulating the first die, the second die and the conductive layer, wherein the gap between the first die and the second die is free of encapsulating material.

11. The semiconductor package as claimed in claim 10, wherein the conductive layer covers back surfaces of the first die and the second die.

12. The semiconductor package as claimed in claim 10, further comprising a plurality of conductive connectors, wherein the first die and the second die are bonded to the interconnect structure through the plurality of conductive connectors, and the underfill encapsulates the plurality of conductive connectors.

13. The semiconductor package as claimed in claim 12, wherein the conductive layer covers side surfaces of each of the first die and the second die and covers an outer surface of the underfill.

14. The semiconductor package as claimed in claim 10, wherein a first height of the first die is higher than a second height of the second die.

15. The semiconductor package as claimed in claim 14, wherein an upper surface of the conductive layer is a flat surface.

16. The semiconductor package as claimed in claim 10, wherein the interconnect structure comprises an interposer.

17. A manufacturing method of a semiconductor package, comprising:

providing an interconnect structure over a carrier;

providing a plurality of dies over the interconnect structure in a side by side manner;

providing an underfill between the plurality of dies and the interconnect structure, wherein the underfill fills a lower part of a gap between adjacent two of the plurality of dies;

providing a conductive layer over the plurality of dies, wherein the conductive layer fills an upper part of the gap between adjacent two of the plurality of dies; and providing an encapsulating material over the interconnect structure for encapsulating the plurality of dies, wherein the gap between the adjacent two of the plurality of dies is free of encapsulating material.

18. The manufacturing method of the semiconductor package as claimed in claim 17, wherein the method of providing the conductive layer comprises printing, dispensing, and spin coating.

19. The manufacturing method of the semiconductor package as claimed in claim 17, further comprising:

performing a thinning process on the encapsulating material till the conductive layer is revealed.

20. The manufacturing method of the semiconductor package as claimed in claim 17, further comprising:

mounting the interconnect structure along with the plurality of dies on a substrate through a plurality of conductive connectors.

* * * * *